(12) United States Patent
Shin

(10) Patent No.: US 6,908,853 B2
(45) Date of Patent: Jun. 21, 2005

(54) METHOD OF FABRICATING A SEMICONDUCTOR DEVICE HAVING REDUCED CONTACT RESISTANCE

(75) Inventor: Dong Suk Shin, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 585 days.

(21) Appl. No.: 10/034,243

(22) Filed: Dec. 28, 2001

(65) Prior Publication Data

US 2003/0045092 A1 Mar. 6, 2003

(30) Foreign Application Priority Data

Sep. 5, 2001 (KR) ........................................ 2001-54512

(51) Int. Cl.[7] .......................................... H01L 21/4763
(52) U.S. Cl. ....................................... 438/637; 438/672
(58) Field of Search ................................. 438/641, 637, 438/672, 657, 675, 647, 623, 780, 595

(56) References Cited

U.S. PATENT DOCUMENTS 6,114,236 A * 9/2000 Sugai .......................... 438/637
6,215,144 B1 * 4/2001 Saito et al. .................. 257/310

FOREIGN PATENT DOCUMENTS

| JP | 7-283217 | 10/1995 |
| JP | 8-279477 | 10/1996 |
| JP | 10-93077 | 4/1998 |

* cited by examiner

Primary Examiner—Hoai Pham
Assistant Examiner—Dilinh Nguyen
(74) Attorney, Agent, or Firm—Ladas & Parry LLP

(57) ABSTRACT

A method of fabricating a semiconductor device having the steps of forming an insulating layer on a silicon substrate; forming a contact hole in the insulating layer so that a portion of the silicon substrate is exposed in the contact hole; performing an interface treatment process to the exposed portion of the silicon substrate, wherein the interface treatment process includes at least a dry cleaning and a hydrogen heat treatment; and forming a selective silicon plug including single crystalline and polycrystalline silicon structures on the exposed portion of the silicon substrate.

20 Claims, 2 Drawing Sheets

METHOD OF FABRICATING A SEMICONDUCTOR DEVICE HAVING REDUCED CONTACT RESISTANCE

BACKGROUND OF THE INVENTION

1. Field of the Invention

The present invention relates generally to a method of fabricating a semiconductor device. More particularly, the present invention relates to a method of forming a contact plug having a reduced contact resistance, preferably adaptable to the fabrication of highly-integrated semiconductor device or a system integrated circuit device.

2. Description of the Prior Art

Recently, the more a semiconductor device is integrated, the more a design rule for realization of the device is reduced. According to such a trend, various processes have been developed, introduced and adopted to obtain better characteristics for the device. Recent developments in contact processes have been widely made to reduce contact resistance, thus improving operational efficiency of the device.

In general, the conventional semiconductor device has a silicon contact material based upon a polysilicon doped with impurities.

If contact were made in an ideal interface state between a silicon substrate and a polysilicon layer, the contact resistance due to the difference in work function would not actually exist in the contact interface established with the same material. Furthermore, when respective impurity concentrations are alike in the silicon substrate and the polysilicon layer, the contact resistance therebetween may be very low.

However, in fact, the contact resistance between the silicon substrate and the polysilicon layer is relatively high.

For example, a contact junction cell having a contact area of 0.10 square microns has a contact resistance of about ten kilo-ohms.

Such a high contact resistance is known in the art to be caused by a native oxide layer and a residue, including carbon, both of which are unfortunately formed in the interface between the silicon substrate and the polysilicon layer.

To remove in advance the native oxide layer and the carbon residue, a conventional polysilicon contact process is performed as soon as a wet cleaning process is completed. However, the high contact resistance is not effectively reduced as expected.

The wet cleaning process currently used in conventional methods has a final cleaning step using a volatile deorganic compound solution and deionized water. This is one of reasons why the removal of the native oxide layer and the carbon residue is not effective.

In recent years, a selective epitaxial growth technique of single crystalline silicon has been proposed as an alternative approach to overcome the increase in resistance due to reduced contact area. The selective epitaxial growth technique serves to increase of resistance resulting from the natural oxide layer and grain boundary in the contact interface.

The selective epitaxial growth technique uses mostly a low-pressure chemical vapor deposition (LPCVD) process. In addition, the LPCVD process employs a reaction gas system composed of dichlorosilane (DCS), $H_2$ and HCl, or monosilane (MS), $H_2$ and HCl.

Furthermore, a high temperature process over about 800° C. is required for the selective epitaxial growth of single crystalline silicon. However, the high temperature process is one of the causes of difficulty in guaranteeing the precise definition of device characteristics.

Accordingly, there exists a strong need for an improved process which can grow single crystal silicon with low contact resistance at the lowest possible temperature.

SUMMARY OF THE INVENTION

It is therefore an object of the present invention to provide a method of fabricating a semiconductor device, which is capable of preventing degradation of the device characteristics due to heat treatment.

Another object of the present invention is to provide a method of fabricating a semiconductor device, capable of reducing contact resistance by removing or decreasing the thickness of a natural oxide layer produced on the contact interface and at crystal defects, such as at a grain boundary.

Still another object of the present invention is to provide a method of fabricating a semiconductor device, adaptable to a contact plug process in the fabrication of highly-integrated semiconductor devices.

These and other objects in accordance with the present invention are attained by a method of fabricating a semiconductor device, the method comprising the steps of forming an insulating layer on a silicon substrate; forming a contact hole in the insulating layer so that a portion of the silicon substrate is exposed in the contact hole; performing an interface treatment process to the exposed portion of the silicon substrate, wherein the interface treatment process includes at least a dry cleaning and a hydrogen heat treatment; and forming a selective silicon plug on the exposed portion of the silicon substrate.

According to another aspect of the present invention, the present invention provides a method of fabricating a semiconductor device, comprising the steps of forming a gate on a silicon substrate; forming an impurity junction region in the silicon substrate under each side of the gate; forming an insulating layer on the entire resultant structure, and then forming a contact hole exposing a surface of the impurity junction region by selectively removing the insulating layer; performing an interface treatment to the exposed surface of the impurity junction region, wherein the interface treatment includes at least a dry cleaning and a hydrogen heat treatment; and forming a selective silicon plug on the exposed surface of the impurity junction region by growing a single crystalline silicon on the exposed surface and subsequently growing a polycrystalline silicon on the single crystalline silicon.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein.

Figure 1:
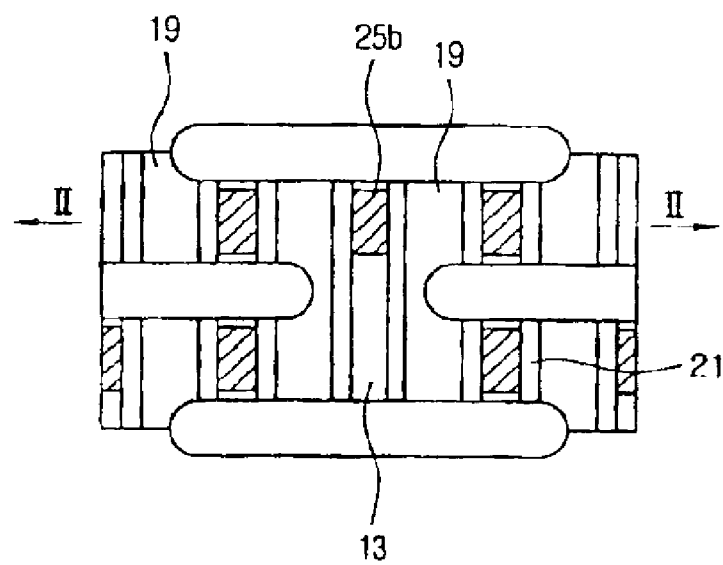
FIG. 1 is a plan view showing a layout of a semiconductor device having a silicon plug formed by a method of fabricating the semiconductor device utilizing the steps of an embodiment of the present invention.
Figure 2:
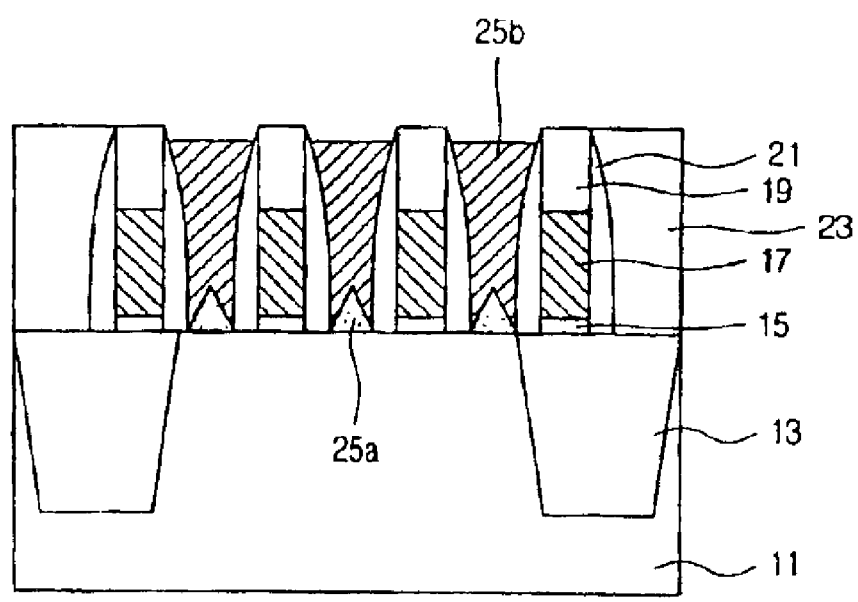
FIG. 2 is a cross-sectional view taken approximately along the line II—II shown in FIG. 1.

Referring to FIGS. 1 and 2, an isolation layer 13, such as a shallow trench, is formed in a silicon substrate 11 to define a device active region and a device isolation region.

Next, an insulating layer (not shown), for a gate oxide layer 15, a conductive layer (not shown), for a gate 17, and another insulating layer (not shown), for a capping layer 19, are sequentially deposited over the silicon substrate 11, including over the trench isolation layer 13.

Both the insulating layers and the conductive layer are then selectively removed by sequentially performing a masking process using photolithography technology and a patterning process using a mask (not shown). Thus the gate oxide layer 15, the gate 17 and the capping layer 19 are thereby formed on the device active region of the silicon substrate 11.

Thereafter, a sidewall spacer 21 is formed on each of the lateral sides of the capping layer 19, the gate 17 and the gate oxide layer 15. Furthermore, by implanting appropriate impurities, an impurity junction region (not shown) is formed in the silicon substrate 11 under each sidewall spacer 21.

Subsequently, an insulating layer 23, also known as an interlayer dielectric layer, is deposited over the entire resultant structure and then subjected to the masking and patterning processes. Therefore, a contact hole (not designated by reference numerals) is formed to expose an upper surface of the impurity junction region on the substrate 11.

Next, an upper surface of the silicon substrate 11, in particular, the exposed upper surface of the impurity junction region, is subjected to an interface treatment process.

Here the interface treatment process determines the contact resistance between the silicon substrate 11 having the impurity junction region and silicon contact material for a silicon plug formed in a following step.

To reduce the contact resistance, the undesirable natural oxide layer should be removed, and undesirable crystal defects, such as grain boundary, should be reduced, and a low temperature process should be carried out.

By the above described method, the present invention provides a way to grow single crystalline material near the contact areas of the silicon substrate 11, and simultaneously form polycrystalline material. The present invention also permits the growth of single crystalline material adjacent the contact areas and the formation of polycrystalline material with improved interface properties by means of a low temperature process performed at a temperature of about 700° C. or below.

For an effective reduction in contact resistance, the above-described interface treatment process is required to be efficiently performed before the formation of the silicon contact material.

The interface treatment process employs five subordinate steps. First, a dry cleaning step is carried out to remove any damaged layer produced in the dry etching process for forming the contact hole. Second, a wet cleaning step is performed to remove carbon residue and the natural oxide layer. Third, an interface-cleaning step is performed by using a high temperature hydrogen heat treatment. Fourth, is a step removing the natural oxide layer by using plasma. Finally, the fifth step is a laser-cleaning step.

In the present invention, the use of high temperature hydrogen heat treatment specifically has an excellent effect on the interface treatment.

In addition, to solve the unexpected problems arising during the high temperature heat treatment, an interface treatment using a laser may be introduced at needed. The laser serves to perform a local interface cleaning, thereby preventing the lowering of the device characteristics due to the high temperature heat treatment.

As described above, when the contact material for the silicon plug is formed, the contact resistance depends on the interface treatment process. Thus, subordinate steps of the interface treatment process may be carried out individually or collectively, regardless of order.

In the subordinate steps of the interface treatment process, detailed process conditions are defined as follows.

The dry cleaning step uses one or more of gas from the group comprising $NF_3$, $O_2$, He, and $N_2$ gases in a suitable mixing ratio. Here a weak plasma having power between 1 and 5 kW, and preferably 2 kW, is applied toward the substrate for five minutes or less.

The wet cleaning step uses, individually or collectively, $H_2O_2$, $H_2SO_4$, $NF_4$, HF, and BOE diluted solutions.

The hydrogen heat treatment step is performed at a low pressure of between about 1 mTorr to about 100 Torr at a high temperature of between about 700° C. to about 1000° C. for thirty minutes or less, while using hydrogen gas at a flow rate of between 1 and 100 slm. An in-situ process in a single facility and ex-situ process in different facilities are both available for the hydrogen heat treatment step.

The step for removing the natural oxide layer by using plasma uses $NF_3$ and $N_2$ gases in a suitable mixing ratio. The gases are supplied in a plasma state to the substrate and heat treatment is carried out at a temperature of between about 100° C. to about 500° C. for ten minutes or less. In particular, the $NF_3$ gas in a remote plasma state produces a fluorine-silicon bond on the substrate surface, thereby effectively maintaining a clean interface.

The laser-cleaning step is intended to locally clean silicon contact parts except from the peripheral circuit regions by means of a laser. Here, important parameter factors are laser power, frequency and the number of applying lasers. The laser power ranges from 1 $mJ/cm^2$ to 10 $J/cm^2$ and the application of the laser is performed between one to one hundred times.

After the above-described interface treatment process, a silicon plug is formed in the contact hole.

Figure 3:
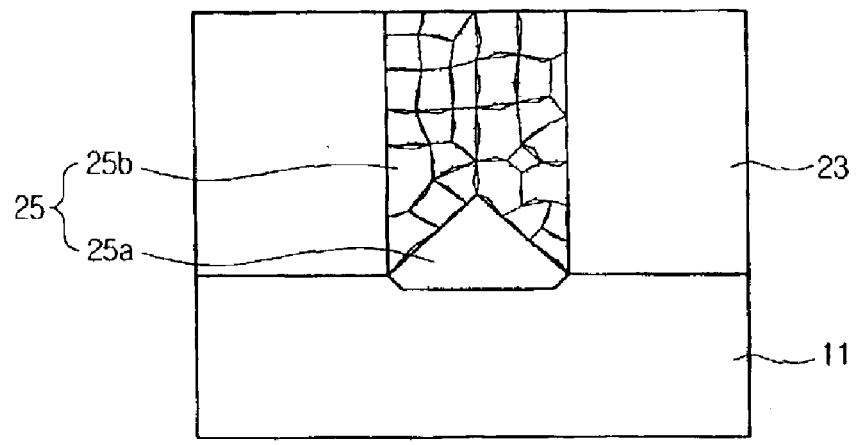
FIG. 3 is a cross-sectional view showing a crystalline structure of a silicon plug formed by a method of fabricating a semiconductor device utilizing the steps of an embodiment of the present invention.

As shown in FIGS. 1 to 3, especially in FIG. 3, the silicon plug 25 comprises a single crystalline silicon 25a and a polycrystalline silicon 25b. The single crystalline silicon 25a is grown first on the silicon contact areas during a deposition process, and the polycrystalline silicon 25b is then grown.

The silicon plug 25 is deposited by using an atmospheric pressure chemical vapor deposition (APCVD) process or a low-pressure chemical vapor deposition (LPCVD) process. The deposition process employs one of the following gas systems, namely, $DCS/H_2/PH_3$, $MS/H_2/PH_3$, and $MS/PH_3$, where DCS and MS refer to a dichlorosilane gas and a monosilane gas, respectively. While the silicon plug 25 is grown, the pressure is set to between 1 and 200 Torr and the temperature is between 500 and 700° C.

In addition, flow rates of MS and DCS gases are each respectively between 100 and 500 sccm, and the flow rate of $H_2$ gas is between 5000 and 20000 sccm.

Furthermore, a flow rate of 1% $PH_3$ is maintained at between 100 and 1000 sccm, and the density of phosphorus is about $1 \times 10^{19}$ to $1 \times 10^{21}$ atoms/cc.

On the other hand, depending on growing conditions, the silicon plug 25 may be made completely of polycrystalline silicon, contrary to the structure shown in FIG. 3.

Figure 4:
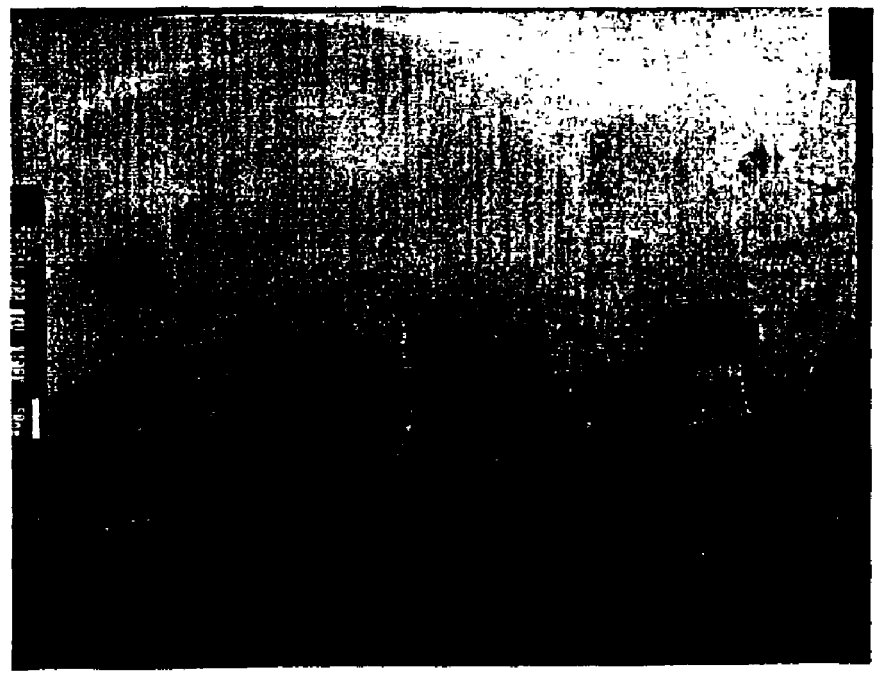
FIG. 4 is a TEM photograph of a semiconductor device having a silicon plug formed by a method for fabricating the semiconductor device utilizing the steps of an embodiment of the present invention.

FIG. 4 shows a TEM photograph taken after the silicon interface treatment under the following conditions. The dry cleaning is performed for twenty seconds while using a mixed gas of $NF_3$, $O_2$ and He. The wet cleaning is performed for twenty seconds while using SC1 and BOE cleaning solutions. The hydrogen heat treatment is performed for one minute at 900° C. under a hydrogen ambient atmosphere. Also, the deposition of the silicon plug is performed at 120 Torr and 630° C. while using a $MS/H_2/PH_3$ gas system.

As fully described hereinbefore, a method for fabricating a semiconductor device according to the present invention has the following advantages and effects.

The present invention can form polycrystalline contact material with improved interface properties by growing contact parts with silicon into a single crystalline structure at a low temperature of about 700° C. or below.

Furthermore, the present invention permits an effective reduction in contact resistance with silicon by employing, individually or collectively, subordinate cleaning steps of the interface treatment process performed before the deposition of the silicon plug.

Additionally, by performing a local interface cleaning with a laser, the present invention can prevent degradation of device characteristics, which would otherwise result from a heat treatment performed at a high temperature of more than 800° C.

The present invention describes a method of forming a polycrystalline silicon plug in which a single crystalline silicon is grown adjacent the contact areas, the silicon plug being formed at a low temperature and the contact resistance thereof being reduced. For the above reason, the method according to the present invention can be advantageously applied to the fabrication of highly integrated semiconductor devices.

In the drawings and specification, there have been disclosed typical preferred embodiments of the invention. Although specific terms are employed, they are used in a generic and descriptive sense only and not for purposes of limitation, the scope of the invention being set forth in, and being limited only by, the following claims.

What is claimed is:

1. A method of fabricating a semiconductor device, comprising the steps of:
    forming an insulating layer on a silicon substrate;
    forming a contact hole in the insulating layer so that a portion of the silicon substrate is exposed in the contact hole;
    performing an interface treatment to the exposed portion of the silicon substrate, wherein the interface treatment includes at least a dry cleaning, a hydrogen heat treatment, wherein the interface treatment further includes a wet cleaning, removal of a natural oxide layer, and a laser cleaning; and
    forming a selective silicon plug on the exposed portion of the silicon substrate.

2. The method of claim 1, wherein the wet cleaning, the natural oxide layer removal, and the laser cleaning are performed individually or collectively, regardless of order.

3. The method of claim 1, wherein the wet cleaning uses, individually or collectively, $H_2O_2$, $H_2SO_4$, $NF_4$, HF, and BOE diluted solutions.

4. The method of claim 1, wherein the natural oxide layer removal is performed at a temperature of between 100 and 500° C. for ten minutes or less by means of plasma generated from mixed gases of $NF_3$ and $N_2$ and then supplied to the silicon substrate.

5. The method of claim 1, wherein the hydrogen heat treatment is performed with a low pressure of between 1 mTorr and 100 Torr at a high temperature of between 700 and 1000° C. for thirty minutes or less by using hydrogen gas with a flow rate of between 1 and 100 slm, thereby allowing an in-situ process in a single facility or an ex-situ process in different facilities.

6. The method of claim 1, wherein the laser cleaning is performed with a laser power of between 1 $mJ/cm^2$ and 10 $J/cm^2$ while the laser is applied at least once and up to one hundred times.

7. The method of claim 1, wherein the step of forming the selective silicon plug is carried out by means of an atmospheric pressure chemical vapor deposition (APCVD) or a low-pressure chemical vapor deposition (LPCVD), employing a gas system of $DCS/H_2/PH_3$, $MS/H_2/PH_3$, or $MS/PH_3$ at a pressure of between 1 and 200 Torr and a temperature of between 500 and 700° C.

8. The method of claim 7, wherein the MS and DCS gases each have a flow rate of between 100 and 500 sccm.

9. The method of claim 7, wherein the $H_2$ gas has a flow rate of between 5000 and 20000 sccm.

10. The method of claim 7, wherein the $PH_3$ gas has a flow rate of between 100 and 1000 sccm, end therein the density of phosphorus is $1 \times 10^{19}$ to $1 \times 10^{21}$ atoms/cc.

11. A method of fabricating a semiconductor device, comprising the steps of:
    forming an insulating layer on a silicon substrate,
    forming a contact hole in the insulating layer so that a portion of the silicon substrate is exposed in the contact hole;
    performing an interface treatment to the exposed portion of the silicon substrate, wherein the interface treatment includes at least a dry cleaning, and a hydrogen heat treatment, wherein the dry cleaning uses one or more gas, in a mixed gas, selected from the group of gases comprising $NF_3$, $O_2$, He and $N_2$, and the dry cleaning step is performed with a plasma power of between 1 and 5 kW for a period of up to five minutes; and
    forming a selective silicon plug on the exposed portion of the silicon substrate.

12. A method of fabricating a semiconductor device comprising the steps of:
    forming a gate on a silicon substrate;
    forming an impurity junction region in the silicon substrate under each side of the gate;
    forming an insulating layer on the entire resultant structure and then forming a contact hole exposing a surface of the impurity junction region by selectively removing the insulating layer;
    performing an interface treatment to the exposed surface of the impurity junction region, wherein the interface treatment includes at least a dry cleaning and a hydrogen heat treatment; and
    forming a selective silicon plug on the exposed surface of the impurity junction region by growing a single crystalline silicon on the exposed surface and subsequently growing polycrystalline silicon on the single crystalline silicon.

13. The method of claim 12, wherein the interface treatment further includes the steps of: a wet cleaning, a natural oxide layer removal, and a laser cleaning, which are performed individually or collectively, regardless of order.

14. The method of claim 13, wherein the wet cleaning uses, individually or collectively, $H_2O_2$, $H_2SO_4$, $NF_4$, HF, and BOE diluted solutions.

15. The method of claim 13, wherein the natural oxide layer removal is performed at a temperature of between 100 and 500° C. for ten minutes or less by means of plasma generated from mixed gases of $NF_3$ and $N_2$ and then supplied to the silicon substrate.

16. The method of claim 13, wherein the laser cleaning is performed with a laser power of between 1 $mJ/cm^2$ and 10 $J/cm^2$ while the laser is applied at least once and up to one hundred times.

17. The method of claim 12, wherein the dry cleaning uses mixed gases of $NF_3$, $O_2$, He and $N_2$, and are performed with a plasma power of between 1 and 5 kW for a period of up to five minutes.

18. The method of claim 12, wherein the hydrogen heat treatment is performed at a low pressure of between 1 mTorr and 100 Torr at a high temperature of between 700 and 1000° C. for thirty minutes or less by using a hydrogen gas with a flow rate of between 1 and 100 s m, allowing an in-situ process in a single facility or an ex-situ process in different facilities.

19. The method of claim 12, wherein the step of forming the selective silicon plug is carried out by means of an atmospheric pressure chemical vapor deposition (APCVD) or a low-pressure chemical vapor deposition (LPCVD), employing a gas system of $DCS/H_2/PH_3$, $MS/H_2/PH_3$, or $MS/PH_3$ with a pressure of between 1 and 200 Torr and at a temperature of between 500 and 700° C.

20. The method of claim 19, wherein the MS and DCS gases each have a flow rate of between 100 and 500 sccm, the $H_2$ gas has a flow rate of between 5000 and 20000 sccm, the $PH_3$ gas has a flow rate of between 100 and 1000 sccm, and the density of phosphorus in tie $PH_3$ gas is $1\times10^{19}$ to $1\times10^{21}$ atoms/cc.

* * * * *